(12) United States Patent
Kanematsu

(10) Patent No.: US 10,763,867 B1
(45) Date of Patent: Sep. 1, 2020

(54) METHOD OF FORMING A SEMICONDUCTOR DEVICE AND STRUCTURE THEREFOR

(71) Applicant: SEMICONDUCTOR COMPONENTS INDUSTRIES, LLC, Phoenix, AZ (US)

(72) Inventor: Masayuki Kanematsu, Hashima (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/659,964

(22) Filed: Oct. 22, 2019

Related U.S. Application Data

(60) Provisional application No. 62/912,863, filed on Oct. 9, 2019.

(51) Int. Cl.
*H03L 7/093* (2006.01)
*H03L 7/089* (2006.01)
*H03H 11/04* (2006.01)

(52) U.S. Cl.
CPC ......... *H03L 7/093* (2013.01); *H03H 11/0422* (2013.01); *H03L 7/0896* (2013.01)

(58) Field of Classification Search
CPC ... H03L 7/0896; H03L 7/093; H03H 11/0433; H03H 11/0422; H03H 11/0455
See application file for complete search history.

(56) References Cited

U.S. PATENT DOCUMENTS

| | | | | |
|---|---|---|---|---|
| 5,392,171 A | * | 2/1995 | Kovner | G11B 5/02 330/127 |
| 5,831,484 A | | 11/1998 | Lukes et al. | |
| 6,344,772 B1 | * | 2/2002 | Larsson | H03H 11/405 327/552 |
| 8,760,203 B1 | * | 6/2014 | Amourah | H03L 7/1075 327/148 |
| 2003/0006809 A1 | | 1/2003 | Enriquez | |
| 2007/0008030 A1 | | 1/2007 | Kasperkovitz | |
| 2007/0182480 A1 | | 8/2007 | Kimura | |
| 2009/0066446 A1 | * | 3/2009 | Sahu | H03H 11/126 333/172 |

OTHER PUBLICATIONS

Dattaguru V. Kamath, "Novel DO-OTA based current-mode grounded capacitor multiplier," Proceedings of the Second International Conference on Inventive Systems and Control (ICISC 2018), IEEE ISBN:978-1-5386-0806-7, pp. 1187-1190.

Ivan Padilla-Cantoya et al., "Enhanced Grounded Capacitor Multiplier and Its Floating Implementation for Analog Filters," IEEE Transactions on Circuits and Systems—II: Express Briefs, vol. 62, No. 10, Oct. 2015, pp. 962-966.

* cited by examiner

*Primary Examiner* — Ryan Johnson
(74) *Attorney, Agent, or Firm* — Robert F. Hightower

(57) ABSTRACT

In one embodiment, a filter circuit is formed to include a transconductance amplifier. The filter circuit has one pair of capacitors connected between at least one input of the amplifier and an input signal that is to be filtered.

20 Claims, 3 Drawing Sheets

METHOD OF FORMING A SEMICONDUCTOR DEVICE AND STRUCTURE THEREFOR

CROSS-REFERENCE TO RELATED APPLICATIONS

This application claims the benefit of U.S. Provisional Patent Application No. 62/912,863, filed on Oct. 9, 2019, the entire contents of which is incorporated herein by reference.

BACKGROUND

In the past, the semiconductor industry utilized various methods and structures to form filters that were used for various applications. One example application was as filters for a phase locked loop system. The filter usually included one or more capacitors to filter signals received by the filter. In a phase locked loop application, the signals may have been from a phase/frequency detector or other portions of the phase locked loop circuits. In some applications, the filter had large capacitors which resulted in a large physical size of the filter. In semiconductor applications, the large capacitor occupied a large portion of a semiconductor device which resulted in higher cost. In some embodiments, the capacitors resulted in some of the signals having some non-linear variations.

Accordingly, it is desirable to have a filter with capacitors that occupy a smaller area, or that have a lower cost, or that result in more linear signals.

Figure 1:
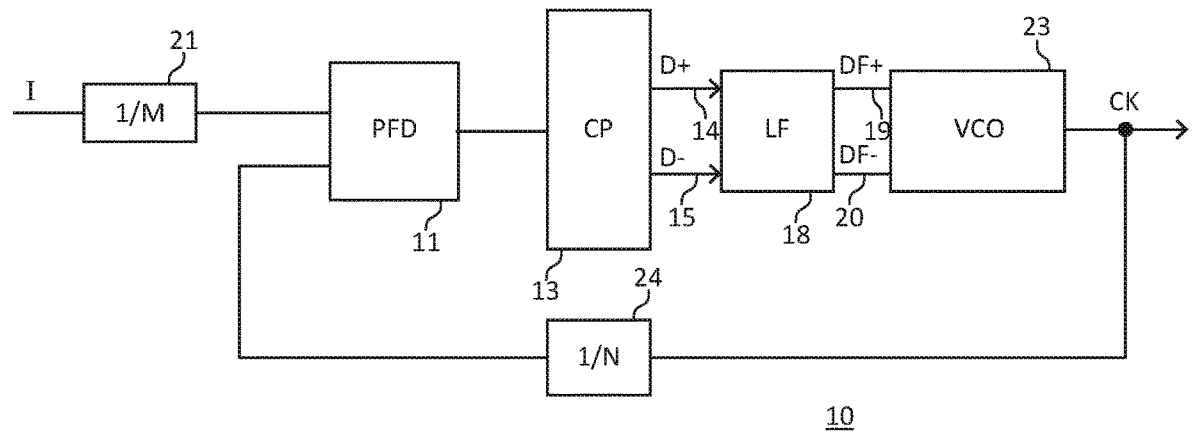
FIG. 1 schematically illustrates an example of an embodiment of a portion of a phase locked loop system in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for some elements including semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments.

The embodiments illustrated and described hereinafter suitably may have embodiments and/or may be practiced in the absence of any element which is not specifically disclosed herein.

DETAILED DESCRIPTION

FIG. 1 schematically illustrates an example of an embodiment of a portion of a phase locked loop system or circuit 10. Circuit 10 includes a phase-frequency detector or phase-frequency detector circuit 11, a charge pump circuit 13, a loop filter circuit 18, a voltage controlled oscillator 23, and a feedback element 24. Circuit 10 generally receives an input signal (I) and forms a clock signal (CK) that, in some embodiments, may be synchronized to the input signal. In some embodiments, circuit 10 may include an optional input scaling circuit 21 that may be proportional to portions of feedback element 24.

Circuit 13 receives signals from circuit 11 and creates current pulses that indicated the deviation of oscillator 23, or clock signal (Ck) from synchronization with the input signal. Circuit 13 may form a differential signal having a positive portion (D+) on output 14 and a negative portion (D−) on output 15 such that signals D+ and D− indicate that oscillator 23 should change frequency in order to synchronize with the input signal (I). Those skilled in the art will appreciate that the D+ and D− signals have values that are substantially opposite to each other such that when D+ has a positive variation the D− signal has a negative variation that is substantially equal in magnitude but opposite in polarity to the D+ signal.

Circuit 18 may be configured to filter the signals received from circuit 13 and form a filtered differential output signal having a filtered positive portion (DF+) on an output 19 and a filtered negative portion (DF−) on an output 20.

Figure 2:
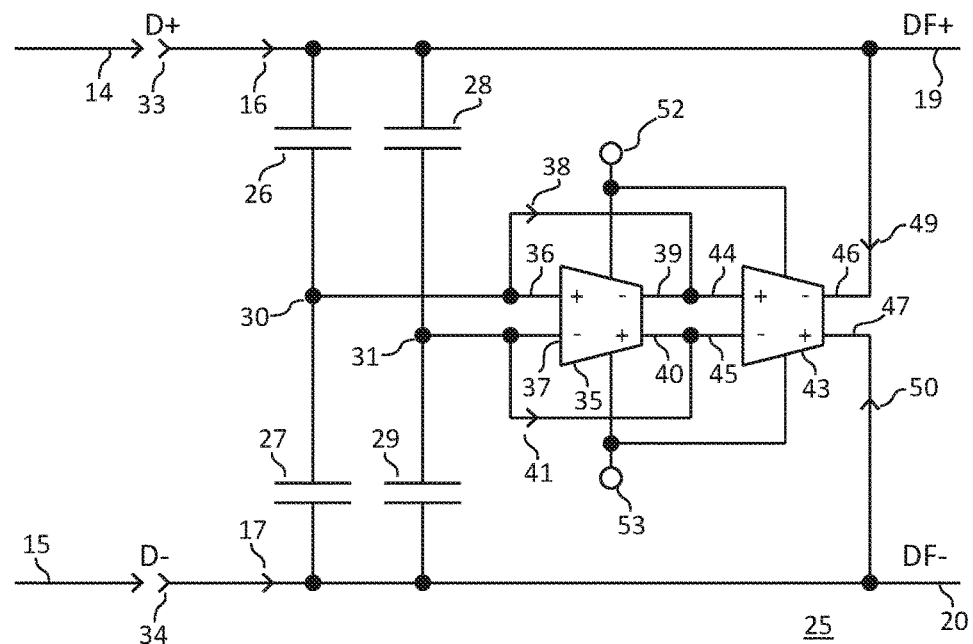
FIG. 2 schematically illustrates a portion of an example of an embodiment of a differential filter circuit that may have an embodiment that may be an alternate embodiment of a portion of the circuit of FIG. 1 in accordance with the present invention.

FIG. 2 schematically illustrates a portion of an example of an embodiment of a differential filter circuit 25 that may have an embodiment that may be an alternate embodiment of circuit 18 (FIG. 1). Circuit 25 includes an input terminal or input 33 configured to receive a first input signal, such as for example the D+ output signal from output 14 of circuit 13, and a another input terminal or input 34 and configured to receive a second input signal, such as for example the D− signal from output 15 of circuit 30. Circuit 25 also includes output 19 that may be configured to form the DF+ signal and output 20 that may be configured to form the DF− signal. Circuit 25 also includes capacitors 26-29 and transconductance amplifiers 35 and 43. Amplifiers 35 and 43 receive an operating voltage between a power input 52 and a common return 53. In an example embodiment, a voltage of approximately three voltage (3V) maybe applied between input 52 and return 53. An embodiment may include that return 53 may be connected to a common ground voltage. An embodiment may include that the voltages applied to inputs 33 and 34 are less than the voltage applied between input 52 and return 53.

As will be seen further hereinafter, an embodiment of circuit 25 may include that amplifier 35 may be commonly connected to capacitor 26 and capacitor 27 at a node 30. Also, an input of amplifier 43 may be commonly connected to node 30, to an input of amplifier 35, and to an output of amplifier 35. In an embodiment, capacitors 26 and 27 may have different values, such as for example different values of capacitance.

Circuit 25 may also have an embodiment that may include that capacitor 26 may be configured to receive a first input signal, such as for example the signal on input 33, and capacitor 27 may be configured to receive a second input signal, such as for example the signal received on input 34, and capacitors 26 and 27 may be configured to be connected between the respective input signal and node 30.

Amplifier 35 may have an embodiment that may include an input, such as for example a positive input 36, connected to node 30 and to a negative output, such as for example output 39, of amplifier 35. An embodiment may include that amplifier 43 may have a positive input, such as for example input 44 connected to output 39 of amplifier 35, to input 36, and to node 30. An embodiment of amplifier 43 may also have a negative input, such as for example input 45, commonly connected to a negative input, such as for example input 37 of amplifier 35. An embodiment may include that a transconductance of amplifier 43 is greater than a transconductance amplifier 35.

In operation, circuit 13 generates current signals to circuit 25. For example, circuit 13 may form the D+ signal as a current 16 flowing into circuit 25 while forming the D− signal as a current 17 flowing out of circuit 25. Conversely, circuit 13 may form the D− signal as current 17 flowing into circuit 25 and the D+ signal as current 16 flowing out of circuit 25. The currents flowing into and out of circuit 25 form a differential voltage between nodes 30 and 31. Amplifier 35 forms output currents 38 and 41 that function to keep inputs 36 and 37 at substantially the same voltage. For example, if node 30 is higher in voltage than node 31, amplifier 35 sinks current 38 into output 39 to decrease the value of node 30 and causes current 41 to flow out to output 40 in order to increase the voltage of node 31. Amplifier 43 receives the same input voltage from nodes 30 and 31 as amplifier 35. Amplifier 43 forms current 49 to flow into and out of output 46 and current 50 to flow into and out of output 47 in the same manner as respective currents 38 and 41. However, the transconductance of amplifier 43 is greater than the transconductance of amplifier 35 therefore current 49 is greater than current 38, and current 50 is greater than current 41. An embodiment may include that amplifier 35 is configured with a substantially unity voltage gain. As will be seen further hereinafter, the larger transconductance of amplifier 43 results in a capacitor multiplication effect that causes capacitors 26 and 29 to have an effective capacitance that is greater than the actual capacitance of capacitors 26 and 29. Consequently, capacitors 26 and 29 can have smaller actual capacitance values and smaller sizes and still have the effect of capacitors that have larger capacitance values.

An embodiment may include that capacitors 26 and 29 have substantially the same capacitance value, and that capacitors 27 and 28 have substantially the same capacitance value.

Figure 3:
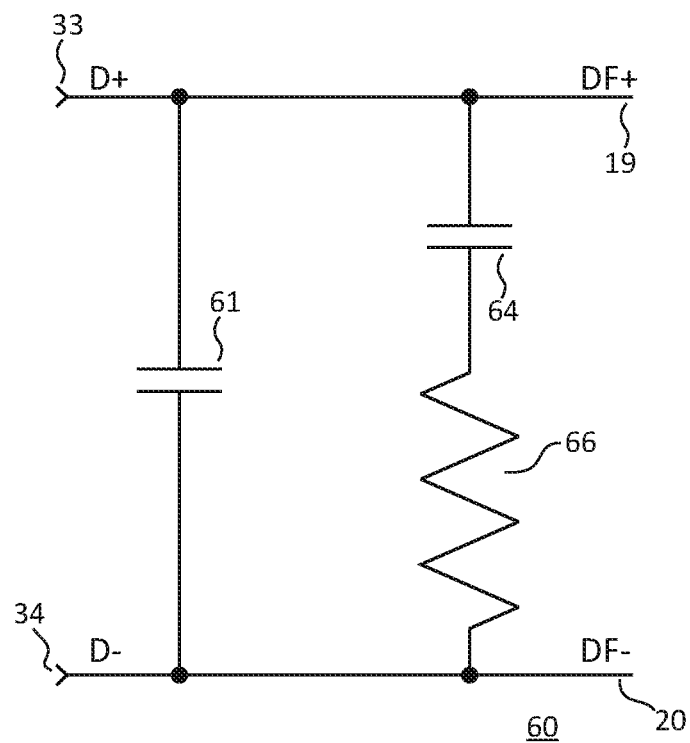
FIG. 3 schematically illustrates an example of an embodiment of an equivalent circuit that may have an embodiment that may be an alternate embodiment of the circuit of FIG. 2 in accordance with the present invention.

FIG. 3 schematically illustrates an example of an embodiment of an equivalent circuit 60 for circuit 25 under the condition that capacitors 26 and 29 have substantially the same capacitance value and capacitors 27 and 28 have substantially the same capacitance value. Equivalent circuit 60 may have an embodiment that may, under some conditions, function equivalently to circuit 25. Circuit 60 includes an equivalent capacitor 61, an equivalent capacitor 64, and an equivalent resistor 66.

Equivalent capacitor 61 may function like a capacitor having a capacitance value represented by following equation:

$$C61 = \frac{2(C26\,C27)}{C26 + C27} \quad \text{(Eq. 1)}$$

Equivalent capacitor 64 may function like a capacitor having a capacitance value that may be represented by the following equation:

$$C64 = \frac{(C26 - C27)^2 + \frac{K43}{K35}(C26 + C27)(C26 - C27)}{2(C26 + C27)} \quad \text{(Eq. 2)}$$

Equivalent resistor 66 may be formed by the operation of amplifier 43 and may function as a resistor having a resistance represented by the following question:

$$R66 = \frac{1}{K35} \frac{(C26 + C27)^2}{(C26 - C27)^2 + \frac{K43}{K35}(C26 + C27)(C26 - C27)} \quad \text{(Eq. 3)}$$

Elements in equations 1-3 each have the following meanings:
C61=The value of equivalent capacitor 61,
C64=The value of equivalent capacitor 64,
R66=The value of equivalent resistor 66,
C26=The actual value of either of capacitors 26 or 29,
C27=The actual value of either of capacitors 27 or 28,
K35=The transconductance (Gm) of amplifier 35, and
K43=The transconductance (Gm) of amplifier 43.

It can be seen from equation Eq.2 for capacitor 64, that the larger transconductance of amplifier 43 (K43) results in equivalent capacitor 64 having a capacitance value that is much larger than the value of any of capacitors 26-29. Therefore, circuit 25 allows using a smaller capacitance for the actual value of capacitors 26-29 and smaller physical capacitor sizes to form a filter that functions as a filter having larger capacitor values.

The smaller physical size reduces costs.

In one example embodiment, capacitors 27 and 28 each have a value of one and one-half pico-farads (1.5 pf), capacitors 26 and 29 each have a value of one-half pico-farad (0.5 pf), amplifier 35 has a transconductance (K35) of two micro-Siemens (2 pS), and amplifier 43 has a transconductance (K43) of sixteen micro-Siemens (16 pS). A Siemen (S) is a unit of one Ampere per one Volt (1 A/1V). The equivalent capacitor 61 has a value of three-fourth pico-farad (0.75 pf) and equivalent capacitor 64 has a value of four and one-quarter pico-farads (4.25 pf). Thus, the value of capacitor 64 is much greater than the value of either of capacitors 26-29. The value of capacitor 61 is also greater than the value of either of capacitors 26-29. Amplifier 43 functions as equivalent resistor 66 having a value of 117,647 ohms.

Additionally, each input of amplifier 35 (FIG. 2) has two capacitors connected to the respective input. Capacitor 26 is connected between input 36 and connected to receive the D+ signal from input 33, and capacitor 27 is connected between input 36 and to receive the D− signal from input 34. Also, capacitor 28 is connected between input 37 and to receive the D+ signal on input 33, and capacitor 29 is connected between input 37 and to receive the D− signal from input 34. Having two capacitors connected to each input divides the amplitude of the voltage applied to each input of amplifier 35 by the value of the two capacitors. Thus, the input voltage is divided by the two capacitors acting a capacitor divider. Applying a smaller input voltage to amplifier 35 results in amplifier 35 operating with improved linearity resulting in a more linear output signal at outputs 19 and 20. Furthermore, the two capacitors reduce externally induced noise and result in each input of amplifier 35 receiving the same amount of noise. The common mode noise from both inputs is then canceled out at the outputs of amplifier 35. Another advantage of having two capacitors connected to each input allows setting the common mode voltage of each of amplifiers 35 and 43 to some value between the value of the voltage received between power input 52 and power return 53. For example, the common mode voltage may be set to approximately one-half of the voltage between 52 and 53.

In order to assist in providing the hereinbefore described functionality for circuit 25, input 33 is commonly connected to a first terminal of capacitor 26, to a first terminal of capacitor 28, to output 19, and to output 46 of amplifier 43. A second terminal of capacitor 26 is commonly connected to node 30, to input 36 of amplifier 35, to output 39 of amplifier 35, to input 44 of amplifier 43, and to a first terminal of capacitor 27. A second terminal of capacitor 27 is commonly connected to a first terminal of capacitor 29, to input 34, to output 20, and to output 47 of amplifier 43. A second terminal of capacitor 28 is commonly connected to node 31, a to a second terminal of capacitor 29, the input 37 of amplifier 35 to output 40 of amplifier 35 and to input 45 of amplifier 43.

Figure 4:
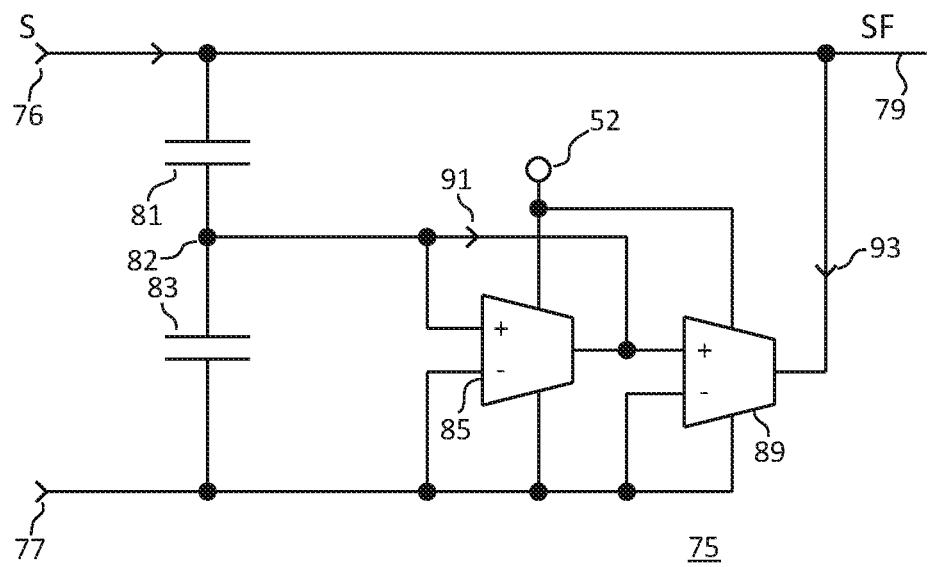
FIG. 4 schematically illustrates an example of a portion of an embodiment of another circuit that may have an embodiment that may be an alternate embodiment of the circuit of FIG. 1 or alternately the circuit of FIG. 2 in accordance with the present invention.

FIG. 4 schematically illustrates an example of a portion of an embodiment of a singled ended filter circuit 75 that may have an embodiment that may be an alternate embodiment of circuit 18 (FIG. 1) or alternately circuit 25 (FIG. 2). Circuit 75 includes an input terminal or input 76 configured to receive a first input signal, such as for example a signal (S) that is to be filtered. Circuit 75 also includes a second input terminal 77. In an embodiment, input 77 may be connected to a common return. An embodiment of the common return may be return 53 (FIG. 2). Circuit 75 also includes an output 79 that may be configured to form a filtered output signal (SF). Circuit 75 has capacitors 81 and 83 and transconductance amplifiers 85 and 89. Amplifiers 85 and 89 receive an operating voltage between power input 52 and input 77. For example, a voltage of approximately three voltage (3V) maybe applied between input 52 and input 77. An embodiment may include that the voltages applied to input 76 is less than the voltage applied between input 52 and input 77.

Amplifiers 85 and 89 are transconductance amplifiers that operate similar to amplifiers 35 and 43. However, amplifiers 85 and 89 are connected in a single ended configuration instead in the differential configuration of amplifiers 35 and 43. Amplifiers 85 and 89 each have a positive input connected to the two capacitors 81 and 83 at a node 82. Amplifier 85 sinks or sources current 91 to maintain a substantially a constant voltage between the positive and negative inputs of amplifier 85 in response to changes of the input signal (S). Amplifier 89 receives the same input voltage as amplifier 85 and forms a current 93 to also maintain the inputs of amplifier 89 at substantially the same voltage. However, the transconductance of amplifier 89 (K89) is greater than the transconductance of amplifier 85 (K85), thus, current 93 is greater than the value of current 91. Consequently, circuit 75 has a capacitor multiplier effect similar to that of circuit 25, as will be seen further hereinafter. Additionally, having two capacitors, capacitors 81 and 83, connected to the input of amplifier 85, and also to amplifier 89, divides the value of the voltage from the input signal (S) which results in more linear operation of amplifiers 85 and 89, similar to amplifiers 35 and 43.

Figure 5:
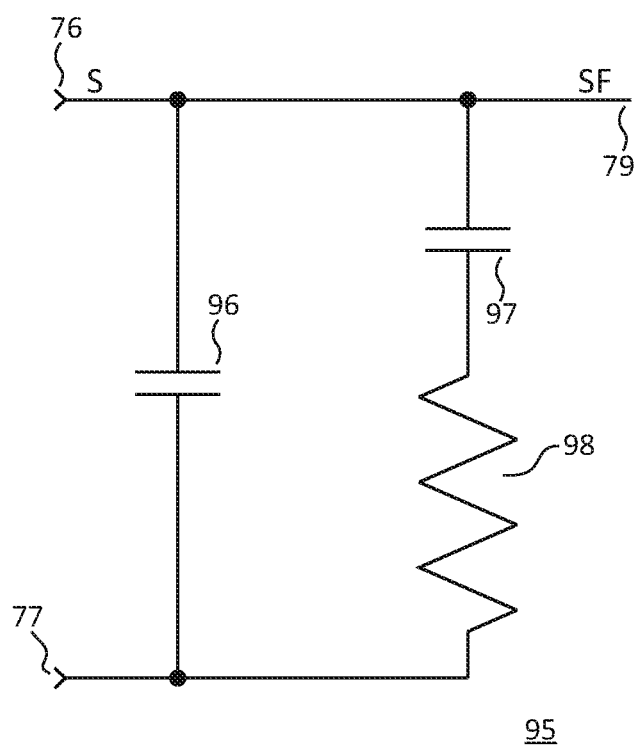
FIG. 5 schematically illustrates an example of a portion of an embodiment of an equivalent circuit that may have an embodiment that may be an equivalent circuit for the circuit of FIG. 4 in accordance with the present invention.

FIG. 5 schematically illustrates an example of a portion of an embodiment of an equivalent circuit 95 that may have an embodiment that may function as an equivalent circuit for circuit 75. Equivalent circuit 95 includes an equivalent capacitor 96, an equivalent capacitor 97, and an equivalent resistor 98.

Equivalent capacitor 96 may function like a capacitor having a capacitance value represented by following equation:

$$C96 = \frac{(C81 C83)}{C81 + C83} \quad \text{(Eq. 4)}$$

Equivalent capacitor 97 may have a capacitance value that may be represented by the following equation:

$$C97 = C81\left(1 + \frac{K89}{K85}\right) \quad \text{(Eq. 5)}$$

Equivalent resistor 98 may be formed by the operation of amplifier 89 and may function as a resistor having a resistance represented by the following question:

$$R98 = \frac{1}{K85 + K89} \quad \text{(Eq. 6)}$$

Elements in equations 4-6 each have the following meanings:
C96=The value of equivalent capacitor 96,
C97=The value of equivalent capacitor 97,
R98=The value of equivalent resistor 98,
C81=The actual value of capacitor 81,
C83=The actual value of capacitor 83,
K85=The transconductance (Gm) of amplifier 85, and
K89=The transconductance (Gm) of amplifier 89.

It can be seen from the equation for capacitor 97, that the larger transconductance of amplifier 89 (K89) results in equivalent capacitor 97 having a capacitance value that is larger than the value of capacitor 81. Therefore, circuit 75 allows using a smaller capacitance for the actual value of capacitors 81 and 83 and smaller physical capacitor sizes to form a filter that functions as a filter having larger capacitor values. The smaller physical size reduces costs.

In order to assist in providing the hereinbefore described functionality for circuit 75, input 76 is commonly connected to a first terminal of capacitor 81, to output 79, and to the output of amplifier 89. A second terminal of capacitor 81 is commonly connected to node 82, the first terminal of capacitor 83, a positive input of amplifier 85, the output of amplifier 85, and to a positive input of amplifier 89. A second terminal of capacitor 83 is commonly connected to input 77, a negative input of amplifier 85, a power return terminal of amplifier 85, a negative input of amplifier 89, and a common return of amplifier 85.

Figure 6:
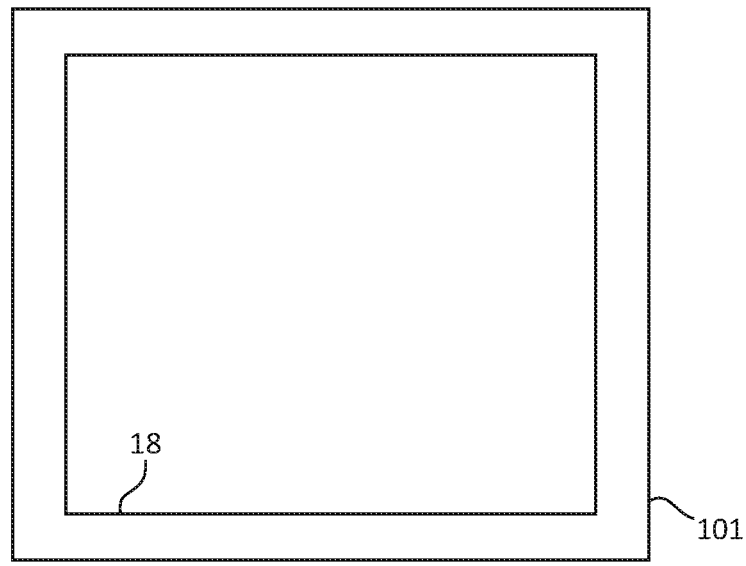
FIG. 6 illustrates an enlarged plan view of a semiconductor device that includes the circuit of FIG. 2 or alternately FIG. 4 in accordance with the present invention.

FIG. 6 illustrates an enlarged plan view of a portion of an embodiment of a semiconductor device or integrated circuit 100 that is formed on a semiconductor die 101. In an embodiment, any one of circuit 25 or 75 may be formed on die 101. Die 101 may also include other circuits that are not shown in FIG. 6 for simplicity of the drawing. The circuit or integrated circuit 100 may be formed on die 101 by semiconductor manufacturing techniques that are well known to those skilled in the art.

From all the foregoing, one skilled in the art will appreciate that an example of an embodiment of a differential filter circuit may comprise, a first transconductance amplifier, such as for example amplifier 35, having a positive input connected to a negative output, such as for example output 39, of the first transconductance amplifier and also coupled to a first node, such as for example node 30, the first transconductance amplifier having a negative input connected to a positive output, such as for example output 40, of the first transconductance amplifier and also coupled to a second node, such as for example node 31;

a first capacitor, such as for example capacitor 26, coupled between the first node and a first input, such as for example input 33, that is configured to receive a first input signal, such as for example signal D+;

a second capacitor, such as for example capacitor 27, coupled between the first node and a second input, such as for example input 34, that is configured to receive a second input signal, such as for example signal D−;

a third capacitor, such as for example capacitor 28, coupled between the second node and the first input;

a fourth capacitor, such as for example capacitor 29, coupled between the second node and the second input; and a second transconductance amplifier, such as for example amplifier 43, having a positive input, such as for example input 44, connected to the negative output of the first transconductance amplifier and having a negative input, such as for example input 45, connected to the positive output of the first transconductance amplifier, the second transconductance amplifier having a negative output, such as for example output 46, connected to the first capacitor and to the third capacitor, and having a positive output, such as for example output 43, connected to the second capacitor and to the fourth capacitor.

An embodiment may include that the negative output of the second transconductance amplifier may be commonly connected to the first input to receive the first input signal, to a first terminal of the first capacitor, and to a first terminal of the third capacitor.

In an embodiment, the first capacitor may have a second terminal connected to the first node.

Another embodiment may include that the third capacitor may have a second terminal connected to the second node.

The differential filter circuit may have an embodiment wherein the positive output of the second transconductance amplifier may be commonly connected to the second input to receive the second input signal, to a first terminal of the second capacitor, and to a first terminal of the fourth capacitor.

An embodiment may include that the second capacitor may have a second terminal connected to the first node.

In an embodiment, the fourth capacitor may have a second terminal connected to the second node.

The differential filter circuit may have an embodiment wherein the first transconductance amplifier may have a unity voltage gain.

An embodiment may include that the first transconductance amplifier may have a first trans conductance.

Another embodiment may include that the second transconductance amplifier may have a second transconductance that is less than the first trans conductance.

An embodiment may include that the second transconductance amplifier may have a second transconductance that is at least approximately four times the first transconductance.

The differential filter may have an embodiment wherein a capacitance value of the second capacitor may be approximately equal to a capacitance value of the third capacitor.

An embodiment may include that a capacitance value of the first capacitor may be approximately equal to a capacitance value of the fourth capacitor.

Those skilled in the art will also appreciate that an example of an embodiment of a filter circuit may comprise, a first capacitor, such as for example capacitor 26, coupled between a first node, such as for example node 30, and a first input, such as for example input 33, that is configured to receive a first input signal, such as for example the D+ signal, the first capacitor having a first value;

a second capacitor, such as for example capacitor 27, coupled between the first node and a second input, such as for example input 34, that is configured to receive a second signal, such as for example the D− signal or alternately the common signal, the second capacitor having a second value that is different from the first value;

a first transconductance amplifier, such as for example amplifier 35, having a positive input connected to the first node and to a negative output, such as for example output 39, of the first transconductance amplifier; and a second transconductance amplifier, such as for example amplifier 43, having a positive input commonly connected to the negative output of the first transconductance amplifier, to the positive input of the first transconductance amplifier, and to the first node; the second transconductance amplifier having a negative input commonly connected to a negative input, such as for example input 37, of the first transconductance amplifier, wherein a first transconductance of the first transconductance amplifier is less than a second transconductance of the second transconductance amplifier.

An embodiment may include that the second transconductance amplifier may form an output current having a value that is substantially a value of a current through the second capacitor multiplied by the second transconductance.

In an embodiment, the first node may not be connected to a common return signal.

In an embodiment, the negative input of the second transconductance amplifier and the negative input of the first transconductance amplifier may be connected to the second input.

Those skilled in the art will also appreciate that an example of an embodiment of a method of forming a semiconductor device may comprise, forming a first input, such as for example input 36, of a first transconductance amplifier, such as for example amplifier 35, commonly coupled to a first capacitor, such as for example capacitor 26, and a second capacitor, such as for example capacitor 27, at a first node, such as for example node 30, wherein the first capacitor may be coupled to receive a first signal, such as for example the D+ signal, and the second capacitor may be coupled to receive a second signal, such as for example the D− signal or alternately the return signal, and wherein the first capacitor has a value that is different from a value of the second capacitor; and forming a first input, such as for example input 44, of a second transconductance amplifier, such as for example amplifier 43, commonly coupled to the first input of the first transconductance amplifier and to a first output, such as for example output 39, of the first transconductance amplifier.

The method may also have an embodiment that may include forming the first input of the first transconductance amplifier as a positive input, forming the first output of the first transconductance amplifier as a negative output, forming the first input of the second transconductance amplifier as a positive input, and forming an inverting output of the second transconductance amplifier connected to the first capacitor.

An embodiment may also include forming a second input of the first transconductance amplifier coupled to a third capacitor, such as for example capacitor 28, and a fourth capacitor, such as for example capacitor 29, at a second node, such as for example node 31, wherein the third capacitor may be coupled to receive the first signal, and the second capacitor may be coupled to receive the second signal, and wherein the third capacitor has a value that is different from a value of the fourth capacitor.

In view of all of the above, it is evident that a novel device and method is disclosed. Included, among other features, is forming a filter having transconductance amplifiers that have a pair of two capacitors connected to each input, a different pair for each input, of the amplifier. The two capacitors reduce the voltage of the applied signal so that the amplifiers may have a more linear operation and for a more linear output signal. The amplifiers also form equivalent capacitors that have capacitance values that are larger than the actual value of the pairs of capacitors. This facilitates reducing the amount area that they occupy on a semiconductor die. This also reduces costs.

While the subject matter of the descriptions are described with specific preferred embodiments and example embodiments, the foregoing drawings and descriptions thereof depict only typical and non-limiting examples of embodiments of the subject matter and are not therefore to be considered to be limiting of its scope, it is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A differential filter circuit comprising:
   a first transconductance amplifier having a positive input connected to a negative output of the first transconductance amplifier and also coupled to a first node, the first transconductance amplifier having a negative input connected to a positive output of the first transconductance amplifier and also coupled to a second node;
   a first capacitor coupled between the first node and a first input that is configured to receive a first input signal;
   a second capacitor coupled between the first node and a second input that is configured to receive a second input signal;
   a third capacitor coupled between the second node and the first input;
   a fourth capacitor coupled between the second node and the second input; and
   a second transconductance amplifier having a positive input connected to the negative output of the first transconductance amplifier, and having a negative input connected to the positive output of the first transconductance amplifier, the second transconductance amplifier having a negative output connected to the first capacitor and to the third capacitor, and having a positive output connected to the second capacitor and to the fourth capacitor.

2. The differential filter circuit of claim 1 wherein the negative output of the second transconductance amplifier is commonly connected to the first input to receive the first input signal, to a first terminal of the first capacitor, and to a first terminal of the third capacitor.

3. The differential filter circuit of claim 2 wherein the first capacitor has a second terminal connected to the first node.

4. The differential filter circuit of claim 3 wherein the third capacitor has a second terminal connected to the second node.

5. The differential filter circuit of claim 1 wherein the positive output of the second transconductance amplifier is commonly connected to the second input to receive the second input signal, to a first terminal of the second capacitor, and to a first terminal of the fourth capacitor.

6. The differential filter circuit of claim 5 wherein the second capacitor has a second terminal connected to the first node.

7. The differential filter circuit of claim 6 wherein the fourth capacitor has a second terminal connected to the second node.

8. The differential filter circuit of claim 1 wherein the first transconductance amplifier has a unity voltage gain.

9. The differential filter circuit of claim 1 wherein the first transconductance amplifier has a first transconductance.

10. The differential filter circuit of claim 9 wherein the second transconductance amplifier has a second transconductance that is less than the first trans conductance.

11. The differential filter circuit of claim 9 wherein the second transconductance amplifier has a second transconductance that is at least approximately four times the first transconductance.

12. The differential filter circuit of claim 1 wherein a capacitance value of the second capacitor is approximately equal to a capacitance value of the third capacitor.

13. The differential filter circuit of claim 1 wherein a capacitance value of the first capacitor is approximately equal to a capacitance value of the fourth capacitor.

14. A filter circuit comprising:
a first capacitor coupled between a first node and a first input that is configured to receive a first input signal, the first capacitor having a first value;
a second capacitor coupled between the first node and a second input that is configured to receive a second signal the second capacitor having a second value that is different from the first value;
a first transconductance amplifier having a positive input connected to the first node and to a negative output of the first transconductance amplifier; and
a second transconductance amplifier having a positive input commonly connected to the negative output of the first transconductance amplifier, to the positive input of the first transconductance amplifier, and to the first node, the second transconductance amplifier having a negative input commonly connected to a negative input of the first transconductance amplifier, wherein a first transconductance of the first transconductance amplifier is less than a second transconductance of the second transconductance amplifier.

15. The filter circuit of claim 14 wherein the second transconductance amplifier forms an output current having a value that is substantially a value of a current through the second capacitor multiplied by the second transconductance.

16. The filter circuit of claim 14 wherein the first node is not connected to a common return signal.

17. The filter circuit of claim 14 wherein the negative input of the second transconductance amplifier and the negative input of the first transconductance amplifier are connected to the second input.

18. A method of forming a semiconductor device comprising:
forming a first input of a first transconductance amplifier commonly coupled to a first capacitor and a second capacitor at a first node wherein the first capacitor is coupled to receive a first signal and the second capacitor is coupled to receive a second signal and wherein the first capacitor has a value that is different from a value of the second capacitor; and
forming a first input of a second transconductance amplifier commonly coupled to the first input of the first transconductance amplifier and to a first output of the first transconductance amplifier.

19. The method of claim 18 further including forming the first input of the first transconductance amplifier as a positive input, forming the first output of the first transconductance amplifier as a negative output, forming the first input of the second transconductance amplifier as a positive input, and forming an inverting output of the second transconductance amplifier connected to the first capacitor.

20. The method of claim 18 further including forming a second input of the first transconductance amplifier coupled to a third capacitor and a fourth capacitor at a second node wherein the third capacitor is coupled to receive the first signal and the second capacitor is coupled to receive the second signal and wherein the third capacitor has a value that is different from a value of the fourth capacitor.

* * * * *